(12) United States Patent
Kim et al.

(10) Patent No.: US 9,558,956 B2
(45) Date of Patent: Jan. 31, 2017

(54) METHOD FOR FABRICATING SEMICONDUCTOR DEVICE

(71) Applicant: SAMSUNG ELECTRONICS CO., LTD., Suwon-Si, Gyeonggi-Do (KR)

(72) Inventors: Bong-Cheol Kim, Seoul (KR); Eun-Shoo Han, Hwaseong-Si (KR); Dong-Seok Lee, Seongnam-Si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 42 days.

(21) Appl. No.: 14/789,420

(22) Filed: Jul. 1, 2015

(65) Prior Publication Data
US 2017/0004973 A1    Jan. 5, 2017

(51) Int. Cl.
| | |
|---|---|
| *H01L 21/308* | (2006.01) |
| *H01L 21/311* | (2006.01) |
| *H01L 21/8234* | (2006.01) |
| *H01L 21/3213* | (2006.01) |
| *H01L 27/108* | (2006.01) |

(52) U.S. Cl.
CPC ..... *H01L 21/3086* (2013.01); *H01L 21/31144* (2013.01); *H01L 21/32139* (2013.01); *H01L 21/823431* (2013.01); *H01L 27/10879* (2013.01); *H01L 27/10897* (2013.01)

(58) Field of Classification Search
None
See application file for complete search history.

(56) References Cited

U.S. PATENT DOCUMENTS

| | | | |
|---|---|---|---|
| 8,426,314 B2 | 4/2013 | Kim | |
| 8,617,998 B2 | 12/2013 | Min et al. | |
| 8,906,757 B2 | 12/2014 | Kim et al. | |
| 2005/0153562 A1* | 7/2005 | Furukawa | H01L 21/0337 438/694 |
| 2006/0046422 A1* | 3/2006 | Tran | H01L 21/0337 438/401 |
| 2006/0231900 A1* | 10/2006 | Lee | H01L 21/76816 257/368 |
| 2006/0273456 A1* | 12/2006 | Sant | H01L 21/3086 257/734 |
| 2007/0210449 A1* | 9/2007 | Caspary | H01L 27/105 257/734 |
| 2009/0170034 A1 | 7/2009 | Lim | |

(Continued)

FOREIGN PATENT DOCUMENTS

| | | |
|---|---|---|
| KR | 1020120001339 | 1/2012 |
| KR | 1020120044005 | 5/2012 |
| KR | 1020130063348 | 6/2013 |

*Primary Examiner* — Lex Malsawma
(74) *Attorney, Agent, or Firm* — F. Chau & Associates, LLC

(57) ABSTRACT

A method for fabricating a semiconductor device is provided, which includes forming a first mask pattern and a second mask pattern on a first layer, forming a block mask that covers the second mask pattern on the first layer, forming first spacers on side walls of the first mask pattern, exposing the second mask pattern through removal of the first mask pattern and the block mask, forming a third mask pattern and a fourth mask pattern through etching of the first layer using the first spacers and the second mask pattern as etch masks, and forming second spacers and third spacers on side walls of the third mask pattern and side walls of the fourth mask pattern, respectively.

20 Claims, 24 Drawing Sheets

(56) References Cited

U.S. PATENT DOCUMENTS

| | | | |
|---|---|---|---|
| 2010/0248481 A1* | 9/2010 | Schultz | G06F 17/5068 438/694 |
| 2011/0003254 A1 | 1/2011 | Chang et al. | |
| 2011/0049630 A1* | 3/2011 | Majumdar | H01L 21/823807 257/351 |
| 2011/0124198 A1 | 5/2011 | Lee et al. | |
| 2012/0118854 A1* | 5/2012 | Smayling | H01L 21/0337 216/37 |
| 2013/0089984 A1* | 4/2013 | Raghunathan | H01L 21/0338 438/696 |
| 2014/0017889 A1 | 1/2014 | Lee et al. | |
| 2014/0024209 A1* | 1/2014 | Jung | H01L 21/823456 438/595 |
| 2014/0103545 A1 | 4/2014 | Lee et al. | |
| 2014/0154885 A1 | 6/2014 | Sim et al. | |
| 2014/0256144 A1 | 9/2014 | Lo et al. | |
| 2014/0295650 A1 | 10/2014 | Li et al. | |

\* cited by examiner

1200

1300

METHOD FOR FABRICATING SEMICONDUCTOR DEVICE

TECHNICAL FIELD

The present inventive concept relates to a semiconductor device, and more particularly, to a method for fabricating a semiconductor device.

DISCUSSION OF THE RELATED ART

A highly scaled high-integration semiconductor device may be implemented by forming micro-patterns of the semiconductor device that are spaced apart from each other by micro-pitches. As the technology for bringing features closer to one another is generally subject to limitations, approaches for increasing feature pitch may involve performing multiple patterning in which a lithography process is performed two or more times on the same unit so that the pattern features may be made closer to each other. Approaches for forming micro-patterns of the semiconductor device using multiple patterning include the use of a double-patterning technology (DPT), in which pattering is performed twice, and a quad-patterning technology (QRT) that applies the double-patterning technology twice.

SUMMARY

An exemplary embodiment of the present inventive concept provides a method for fabricating a semiconductor device, which can simultaneously apply a multi-patterning technology with different pitch densities to form patterns by micro-pitches.

According to an aspect of the present inventive concept, there is provided a method for fabricating a semiconductor device. The method includes forming a first mask pattern and a second mask pattern on a first layer. A block mask is formed on the first layer to cover the second mask pattern and not the first mask pattern. First spacers are formed on side walls of the first mask pattern. The first mask pattern and the block mask are removed to expose the second mask pattern. The first layer is etched using the first spacers and the second mask pattern as etch masks to form a third mask pattern and a fourth mask pattern. Second spacers and third spacers are formed on side walls of the third mask pattern and side walls of the fourth mask pattern, respectively.

According to an aspect of the present inventive concept, a method for fabricating a semiconductor device includes forming a first layer on a semiconductor substrate. A second layer is formed on the first layer. The second layer is etched to form a first mask pattern and a second mask pattern. A block mask is formed on the second layer to cover the second mask pattern and not the first mask pattern. First spacers are formed on two opposite side walls of the first mask pattern. The block mask is removed, after the first mask pattern is removed, to expose the second mask pattern. The second layer is etched using the first spacers and the second mask pattern as etch masks to form a third mask pattern and a fourth mask pattern. Second spacers and third spacers are formed on two opposite side walls of the third mask pattern and the fourth mask pattern, respectively. The third mask pattern and the fourth mask pattern are removed. The semiconductor substrate is etched using the second spacers as etch masks.

According to an aspect of the present inventive concept, a method for fabricating a semiconductor device includes forming a first layer on a semiconductor substrate and forming a second layer on the first layer. A first mask pattern and a second mask pattern are formed on the second layer. First spacers and second spacers are formed on two opposite side walls of the first mask pattern and the second mask pattern, respectively. A block mask is formed in the second layer to cover the second spacers but not the first spacers. The block mask is removed after the first mask pattern is removed. A third mask pattern and a fourth mask pattern are formed using the first spacers, the second spacers, and the second mask pattern as masks. Third spacers and fourth spacers are formed on two opposite side walls of the third mask pattern and the fourth mask pattern, respectively. The third mask pattern and the fourth mask pattern are removed. The semiconductor substrate is etched using the third spacers and the fourth spacers as etch masks.

A method for fabricating a semiconductor device includes forming a sacrificial layer on a semiconductor substrate. A first mask pattern and a second mask pattern are formed, spaced apart from each other, on the sacrificial layer. The first mask pattern is formed over a region of the semiconductor substrate having a first pattern pitch and the second mask pattern is formed over a region of the semiconductor substrate having a second pattern pitch that is less than the first pattern pitch. A block mask is formed over the second mask pattern but not the first mask pattern. A spacer layer having a constant thickness is formed over the sacrificial layer, the first mask pattern, and the block mask. The spacer layer is partially removed such that a portion of the spacer layer remains on two opposing sidewalls of the first mask pattern. The sacrificial layer is etched using the remaining portion of the spacer layer as a mask Additional advantages, subjects, and features of the inventive concept will be set forth in part in the description which follows and in part will become apparent to those having ordinary skill in the art upon examination of the following or may be learned from practice of the inventive concept.

BRIEF DESCRIPTION OF THE DRAWINGS

The above and other objects, features and aspects of the present inventive concept will be more apparent from the following detailed description taken in conjunction with the accompanying drawings, in which.

DETAILED DESCRIPTION OF THE EMBODIMENTS

FIGS. 1 to 9 are schematic diagrams illustrating intermediate steps of a method for fabricating a semiconductor device according to an exemplary embodiment of the present inventive concept.

Figure 1:
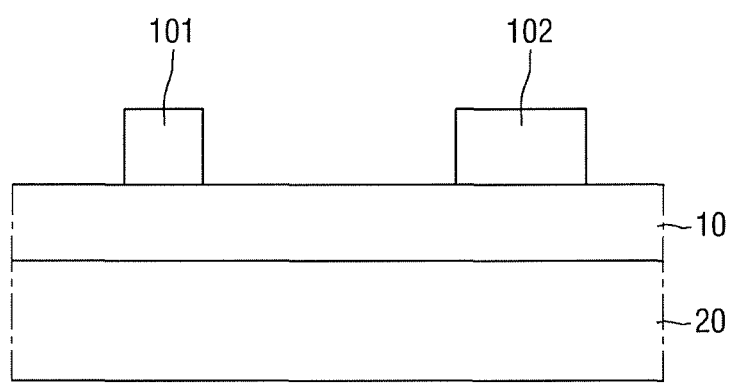
FIGS. 1 to 9 are schematic diagrams illustrating intermediate steps of a method for fabricating a semiconductor device according to an exemplary embodiment of the present inventive concept.

First, referring to FIG. 1, a first layer 10 may be formed on a second layer 20. A first mask pattern 101 and a second mask pattern 102 may be formed to be spaced apart from each other on the first layer 10.

The second layer 20 may be a semiconductor substrate or an epitaxial layer that is epitaxially grown from the semiconductor substrate. In this case, the semiconductor device that is fabricated according to an embodiment of the present inventive concept may be a fin type semiconductor device.

The first layer 10 may be formed on the second layer 20. In the method for fabricating a semiconductor device according to some exemplary embodiments of the present inventive concept, the first layer 10 may be used as a sacrificial layer for applying multi-patterning thereto.

The first layer 10 may be, for example, a hard mask layer. For example, the first layer 10 may be made of polysilicon, silicon oxide ($SiO_2$), or silicon nitride ($Si_3N_4$), but the present inventive concept is not limited thereto.

The second layer 20 may be, for example, a silicon substrate or a SOI (Silicon-On-Insulator) layer. Alternatively, the second layer 20 may be made of bulk silicon or another material, for example, silicon germanium, indium antimonide, lead telluride, indium arsenide, indium phosphide, gallium arsenide, or gallium antimonide.

The first and second mask patterns 101 and 102 may be formed to be spaced apart from each other on the first layer 10.

As is described in greater detail below, with respect to a region that requires micro-fin pitches, multi-patterning may be performed using spacers formed on side walls of the mask pattern as etch masks. With respect to a region that requires further micro-fin pitches, spacers may be formed on side walls of the resultant material of previous patterning, and patterning may be performed once more using the spacers as etch masks.

In a method for fabricating a semiconductor device according to an exemplary embodiment of the present inventive concept, the first mask pattern 101 may be formed on a region where patterning is to be performed twice in an aligned position using the spacers. The second mask pattern 102 may be formed on a region where patterning is to be performed once using the spacers.

In a method for fabricating a semiconductor device according to some exemplary embodiments of the present inventive concept, the second mask pattern 102 may be used as an etch mask for etching the first layer 10, as is described in further detail below. Accordingly, the second mask pattern 102 may include a material having an etch selectivity with respect to the first layer 10.

Figure 2:
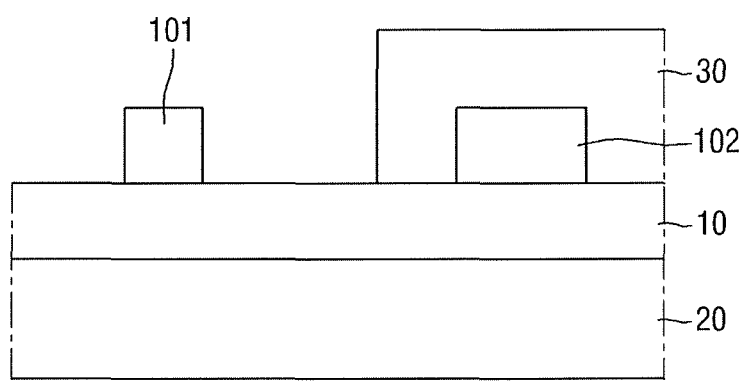

Referring to FIG. 2, a block mask 30 that covers the second mask 102 may be formed on the first layer 10. For example, the block mask 30 may be formed exclusively on a region where double patterning is performed.

The block mask 30 may include, for example, a photoresist block, but the present inventive concept is not limited thereto. For example, since the block mask 30 may remain without being etched in the case of removing the first mask pattern 101 by etching in according to a process which is described in detail below, the block mask may be made of a relatively etch-resistant material in comparison to the first mask pattern 101. For example, the block mask 30 may include amorphous carbon block, SOH (Spin-On Hard mask), or SOG (Spin-On-Glass).

Figure 3:
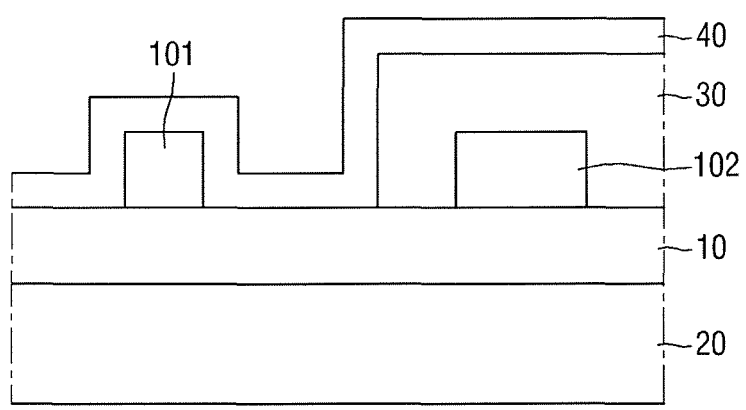

Referring to FIG. 3, a first spacer layer 40 may be conformally formed on the first layer 10, the first mask pattern 101, and the block mask 30.

The first spacer layer 40 may be formed using, for example, ALD (Atomic Layer Deposition). Further, the first spacer layer 40 may include, for example, a nitride layer or an oxynitride layer, but the present inventive concept is not limited thereto.

Figure 4:
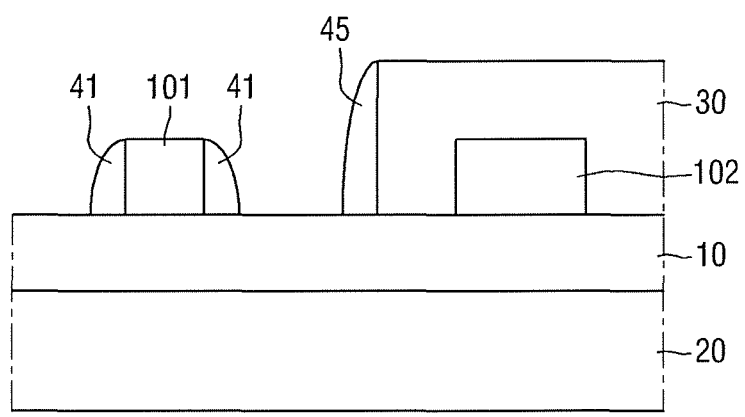

Referring to FIG. 4, the first spacer layer 40 (in FIG. 3) may be partially removed, with a portion of the first spacer layer 40 (in FIG. 3) remaining on a side wall of the first mask pattern 101 to form first spacers 41. In this case, upper surfaces of the first layer 10, the block mask 30, and the first mask pattern 101 may be exposed.

Removal of the first spacer layer 40 (in FIG. 3) may be performed using, for example, an etching process.

The first spacers 41 may be formed on both side walls of the first mask pattern 101, but the present inventive concept is not limited thereto. Although not illustrated, a process of removing one of the first spacers 41 formed on both side walls of the first mask pattern 101 may be performed to form the first spacer 41 exclusively on one side wall of the first mask pattern 101.

The first spacers 41 may function as masks for etching the first layer 10. Accordingly, the first spacer layer 40 (in FIG. 3) may be formed with different thicknesses according to the pattern width of the mask pattern desired to be obtained through etching of the first layer 10.

In the process of removing the first spacer layer 40 (in FIG. 3), a first dummy spacer 45 may be formed on a side wall of the block mask 30. In the case of performing patterning using the first dummy spacer 45 as an etch mask, patterning may be performed once more with respect to the second layer 20. Accordingly, if needed, the first dummy spacer 45 may be removed.

The height of the first dummy spacer 45 that is formed on the side wall of the block mask 30 may be different from the height of the first spacer 41. For example, since the block mask 30 is formed to cover the second mask pattern 102, the height of the block mask 30 may be higher than the height of the first mask pattern 101. Accordingly, the first dummy spacer 45 may be formed on the side wall of the block mask 30 with a height that is higher than the height of the first spacer 41 that is formed on the side wall of the first mask pattern 101.

Figure 5:
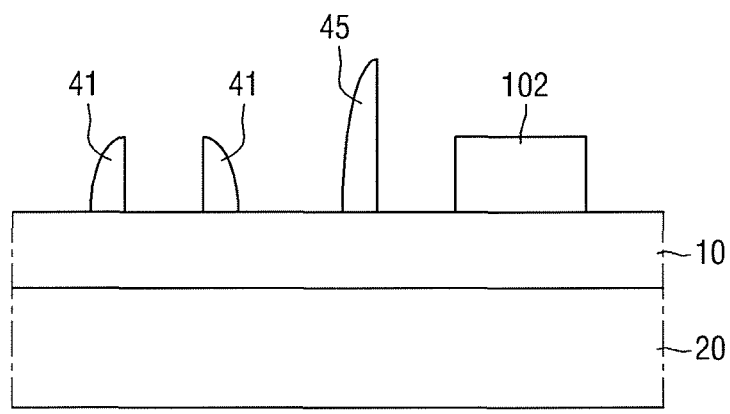

Referring to FIG. 5, the first mask pattern 101 (in FIG. 4) and the block mask 30 may be removed. The upper surface of the first layer 10 in a region where the first mask pattern 101 (in FIG. 4) is formed and the second mask pattern 102 may be exposed.

In order to prevent the second mask pattern 102 from being removed during removal of the first mask pattern 101, the block mask 30 may be removed after the first mask pattern 101 is removed.

Removal of the first mask pattern 101 may be performed using, for example, an ashing or cleaning process. Removal of the block mask 30 may be performed using an ashing or strip process.

Figure 6:
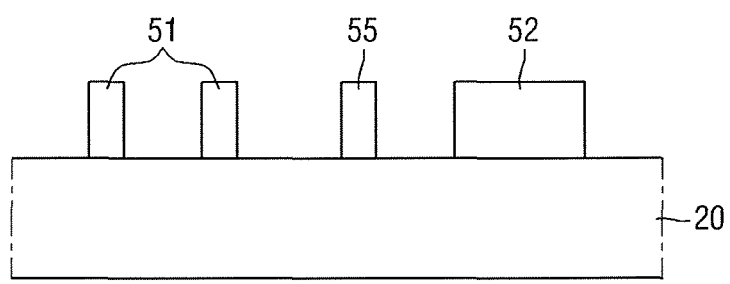

Referring to FIGS. 5 and 6, the first layer 10 may be etched using the first spacers 41, the first dummy spacer 45, and the second mask pattern 102 as etch masks. A third mask pattern 51, a fourth mask pattern 52, and a dummy mask pattern 55 may be formed through etching of the first layer 10.

When the fourth mask pattern 52 is formed using the second mask pattern 102 as an etch mask, the side wall of the fourth mask pattern 52 may be aligned with the side wall of the second mask pattern 102. Further, in the case where the third mask pattern 51 is formed using the first spacers 41 as etch masks, the side wall of the third mask pattern 51 may be aligned with the side wall of the first spacers 41. Accordingly, through the forming of the third and fourth mask patterns 51 and 52, misalignment between elements may be prevented, and product reliability of a semiconductor device made in this way may be increased.

In some exemplary embodiments of the present inventive concept, etching of the first layer 10 may be performed using, for example, a wet etching method. For example, an HF-based wet etching may be performed. However, the present inventive concept is not limited to this approach. The first layer 10 may be etched using a plasma etching method.

The third and fourth mask patterns 51 and 52 may be simultaneously formed by etching the first layer 10. For example, mask patterns for multi-patterning with different pitch densities may be simultaneously formed without the necessity of any additional processes. Accordingly, the complexity and time required for the process of fabricating a semiconductor device can be reduced, and thus fabrication costs may be reduced.

Figure 7:
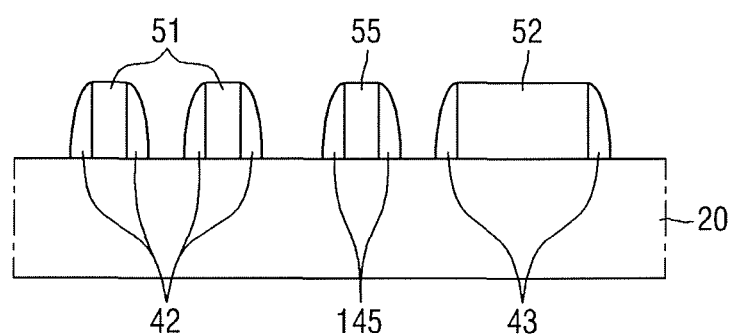

Referring to FIG. 7, second spacers 42 may be formed on both side walls of the third mask pattern 51. Third spacers 43 may be formed on both side walls of the fourth mask pattern 52. Further, second dummy spacers 145 may be formed on both side walls of the dummy mask pattern 55.

Forming of the second and third spacers 42 and 43 and the second dummy spacers 145 may be performed in substantially the same process as the process of forming the first spacers 41 (in FIG. 4) as described above. For example, after a spacer layer is conformally formed on the third and fourth mask patterns 51 and 52 and the dummy mask pattern 55, the second and third spacers 42 and 43 and the second dummy spacers 145 may be formed through removal of a part of the spacer layer.

Figure 8:
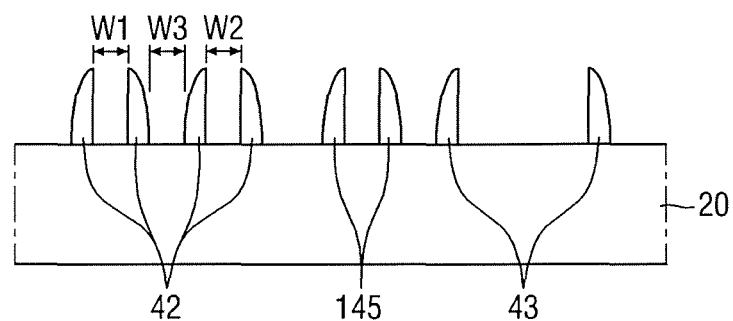

Referring to FIG. 8, the third and fourth mask patterns 51 and 52 and the dummy mask patterns 55 may be removed. Removal of the third and fourth mask patterns 51 and 52 and the dummy mask patterns 55 may be performed using, for example, an ashing or cleaning process.

Figure 9:
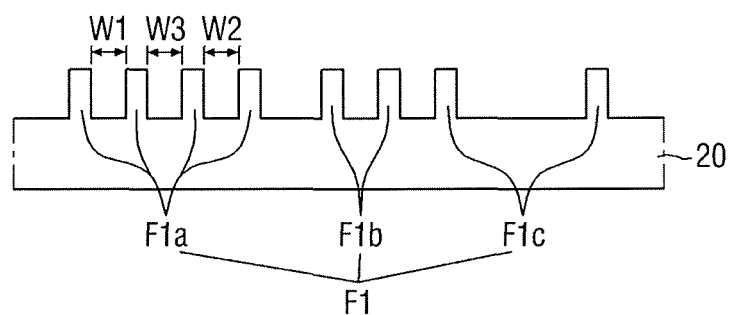

Referring to FIG. 9, the second layer 20 may be etched using the second and third spacers 42 and 43 (in FIG. 8) and the second dummy spacers 145 (in FIG. 8) as etch masks, and first fins F1 may be formed. In this case, the second layer 20 may be a semiconductor substrate or an epitaxial layer that is epitaxially grown from the substrate.

A first fin group F1a may be formed at equal distances on a region where patterning is performed. For example, distances w1, w2, and w3 among the patterns may be equal to each other. However, this is merely exemplary, and the distances w1, w2, and w3 among the patterns may also be different from each other by adjusting the distances among the second spacers 42 (in FIG. 8).

The first group F1a of the first fins F1 corresponds to fins that are formed through etching of the second layer 20 using the second spacers 42 (in FIG. 8) as etch masks. The second group F1b corresponds to fins that are formed through etching of the second layer 20 using the second dummy spacers 145 (in FIG. 8) as etch masks. The third group F1c corresponds to fins that are formed through etching of the second layer 20 using the third spacers 42 (in FIG. 8) as etch masks.

In the case where the second layer 20 is a semiconductor substrate, the first fins F1 may be parts of the second layer 20, or may include an epitaxial layer that is epitaxially grown from the second layer 20.

In the case where the first fins F1 are fabricated as fin type semiconductor devices according to an exemplary embodiment of the present inventive concept, fin field effect transistors (FinFETs) may be formed. The fin field effect transistor may be accordingly configured to suppress the short channel effect of the transistor and current control ability at low voltage may be enhanced.

Figure 10:
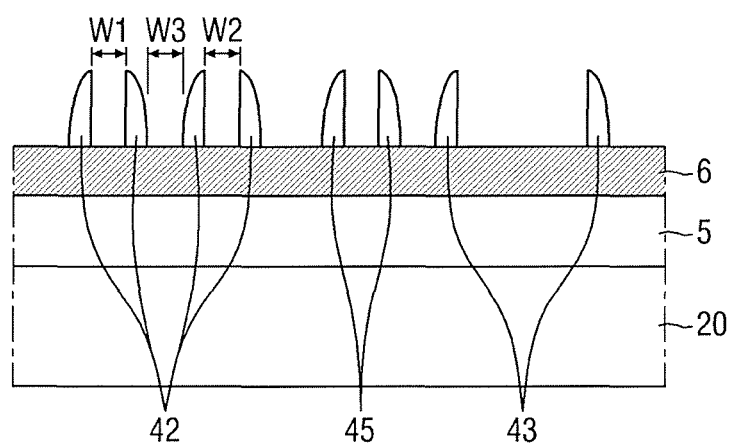
FIGS. 10 and 11 are schematic diagrams illustrating intermediate steps of a method for fabricating a semiconductor device according to an exemplary embodiment of the present inventive concept.
Figure 11:
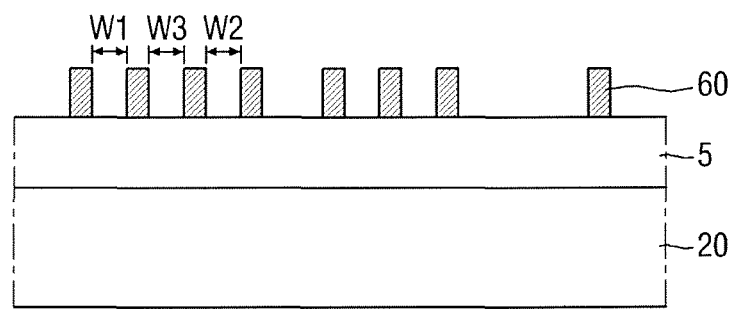

FIGS. 10 and 11 are diagrams illustrating intermediate steps of a method for fabricating a semiconductor device according to an exemplary embodiment of the present inventive concept. Hereinafter, detailed explanation of the duplicate portions according to the above-described embodiment will be omitted, and explanation will be focused on those characteristics that are different from the approach discussed above with respect to FIGS. 1-9.

Referring to FIGS. 10 and 11, the semiconductor device may further include a conductive material layer 6 and a lower layer 5 provided between the second and third spacers 42 and 43 and the second dummy spacers 145 and the second layer 20.

The conductive material layer 6 may include a conductive material. In some embodiments of the present inventive concept, such a conductive material may include at least one of polycrystalline silicon, metal silicide compounds, and conductive metal nitride, but the present inventive concept is not limited thereto.

Conductive patterns 60 may be formed at equal distances w1, w2, and w3 on a region where the conductive material layer 6 is etched using the second spacers as etch masks. For example, the distances w1, w2, and w3 among the patterns may be equal to each other, but the present inventive concept is not limited thereto. The distances w1, w2, and w3 among the patterns may also be made to be different from each other by adjusting the distances among the second spacers 42.

The conductive patterns 60 may electrically connect a device arranged on the lower layer and a device arranged on the conductive patterns 60 to each other. According to the method for fabricating a semiconductor device according to an exemplary embodiment of the present inventive concept, micro-patterns can be simultaneously formed even in the case where the conductive patterns 60 having various accuracies are required. Accordingly, the complexity and time required for the process of fabricating a semiconductor device can be reduced, and thus the cost of fabrication may be reduced.

FIGS. 12 to 18 are diagrams illustrating intermediate steps of a method for fabricating a semiconductor device according to an exemplary embodiment of the present inventive concept. Explanation will be focused primarily on those features that are different than discussed above with respect to FIGS. 1-11. Those features not discussed may be assumed to be substantially identical to corresponding features described above with respect to the other figures.

Figure 12:
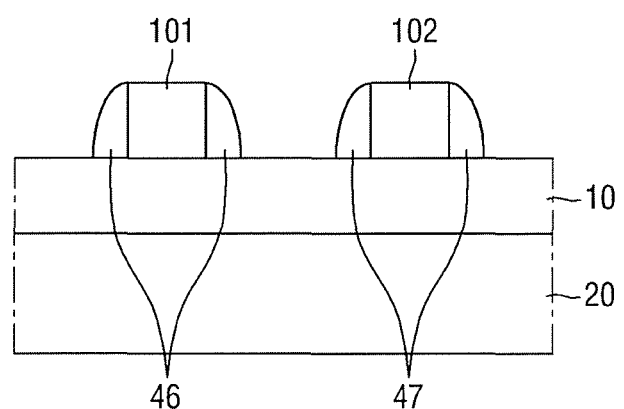
FIGS. 12 to 18 are schematic diagrams illustrating intermediate steps of a method for fabricating a semiconductor device according to an exemplary embodiment of the present inventive concept.
Figure 13:
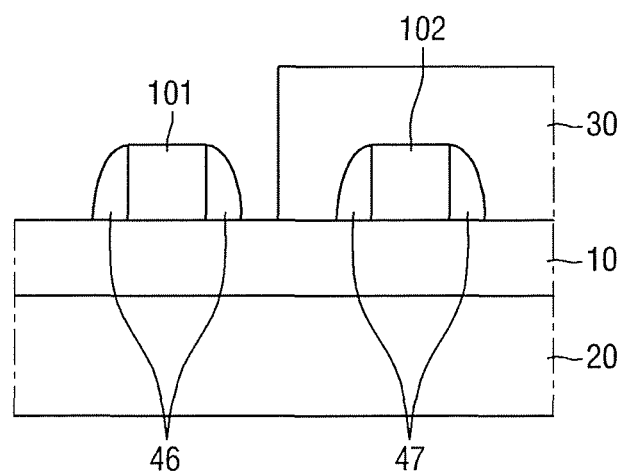

Referring to FIGS. 6, 12, and 13, first and second spacers 46 and 47 may be formed on side walls of first and second mask patterns 101 and 102, and a block mask 30 that covers the second mask 102 and the second spacers 47 may be formed on the first layer 10.

The first and second spacers 46 and 47 may be formed by conformally forming a spacer layer on the first and second mask patterns 101 and 102 and the first layer 10 and then removing parts of the spacer layer.

In a method for fabricating a semiconductor device according to an exemplary embodiment of the present inventive concept, a region where patterns having different pitches are to be formed is provided by forming the block mask 30 before the first spacers 41 (in FIG. 6) are formed. However, in this embodiment, the block mask 30 may be formed after the second spacers 47 are formed on the side walls of the second mask pattern 102. Accordingly, the first dummy spacers 45 (in FIG. 6) are not formed.

Figure 14:
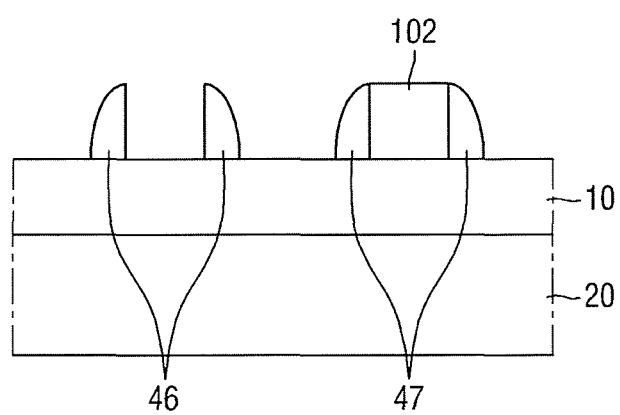

Referring to FIGS. 13 and 14, the first mask pattern 101 and the block mask 30 are removed. In order to prevent the second mask pattern 102 from being removed together during removal of the first mask pattern 101, the block mask 30 may be removed after the first mask pattern 101 is removed.

Figure 15:
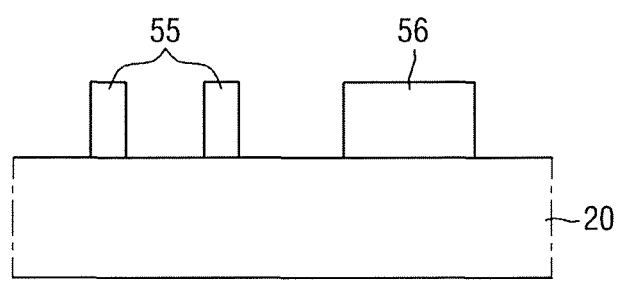
Figure 16:
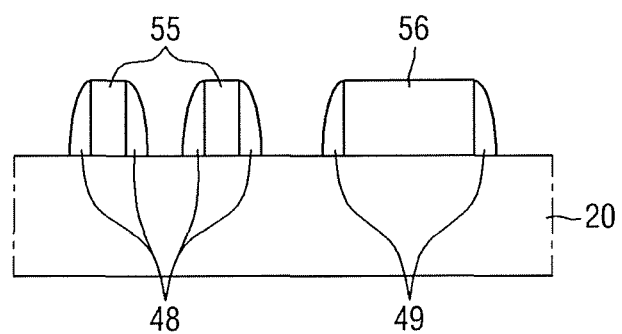

Referring to FIGS. 14, 15, and 16, third and fourth mask patterns 55 and 56 may be formed through etching the first layer 10 using the first and second spacers 46 and 47 and the second mask pattern 102 as etch masks.

The third and fourth mask patterns 55 and 56 may be simultaneously formed through etching of the first layer 10. For example, mask patterns for multi-patterning with different pitch densities may be simultaneously formed without the necessity of any additional processes. Accordingly, the complexity and time required for the process of fabricating a semiconductor device can be reduced, and thus the cost associated with fabrication may be reduced.

Thereafter, third and fourth spacers 48 and 49 may be formed on both side walls of the third and fourth mask layer patterns 55 and 56. In a process that is described in greater detail below, the third spacers 48 may function as etch masks for forming patterns having a relatively narrow pitch, and the fourth spacers 49 may function as etch masks for forming patterns having a relatively wide pitch.

Figure 17:
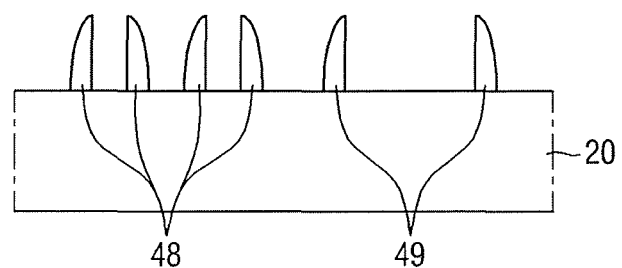
Figure 18:
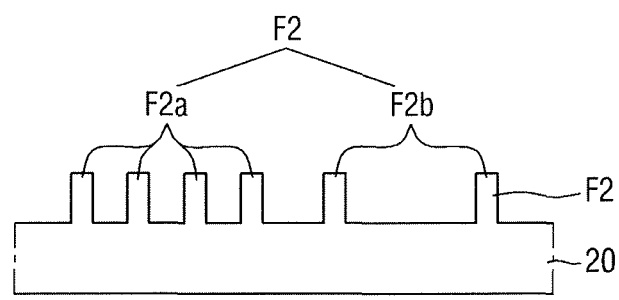

Referring to FIGS. 16, 17, and 18, the third and fourth mask layer patterns 55 and 56 may be removed, and the second layer 20 may be etched using the third and fourth spacers 48 and 49 as etch masks. As a result, second fins F2 are formed on the second layer 20.

Figure 19:
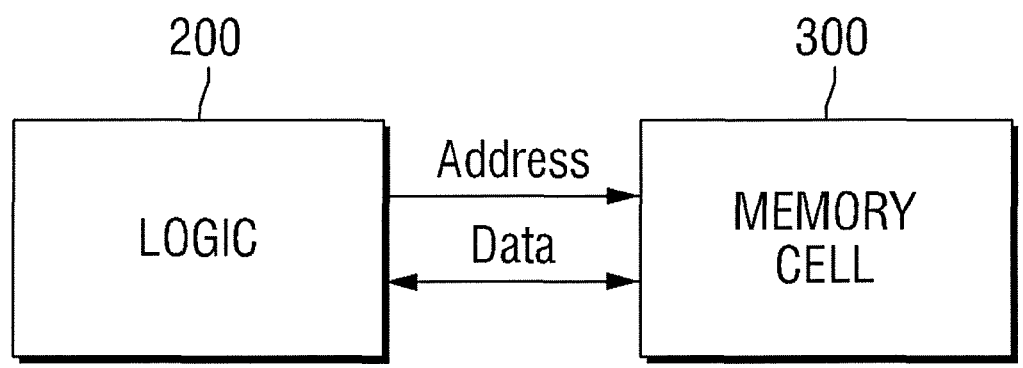
FIG. 19 is a block diagram illustrating a memory system including a semiconductor device that is fabricated using a method for fabricating a semiconductor device according to exemplary embodiments of the present inventive concept.

FIG. 19 is a block diagram of a memory system including a semiconductor device that is fabricated using a method for fabricating a semiconductor device according to exemplary embodiments of the present inventive concept.

Referring to FIG. 19, a memory system may include a logic region 200 and a memory cell region 300. In the memory cell 300, a memory device for storing data may be formed. In some exemplary embodiments of the present inventive concept, the memory cell 300 may include, for example, a SRAM (Static Random Access Memory) cell, but the present inventive concept is not limited thereto. For example, the memory cell 300 may include a DRAM (Dynamic Random Access Memory) or a PRAM (Phase-change Random Access Memory).

A plurality of semiconductor devices may be formed in the logic region 200. The plurality of semiconductor devices may be used to receive data that is read from the memory cell region 300 or to provide data to be written. Examples of such semiconductor devices may include an inverter, a pre-charger, and the like, but the present inventive concept is not limited to such examples.

In a memory system using fin type semiconductor devices, the logic region 200 may require relatively small micro-fin pitches in comparison to the size of pitches within the memory cell region 300. In a method for fabricating a semiconductor device according to some exemplary embodiments of the present inventive concept, multi-patterning with different pitch densities may be simultaneously performed with semiconductor patterns having different fin pitches.

Figure 20:
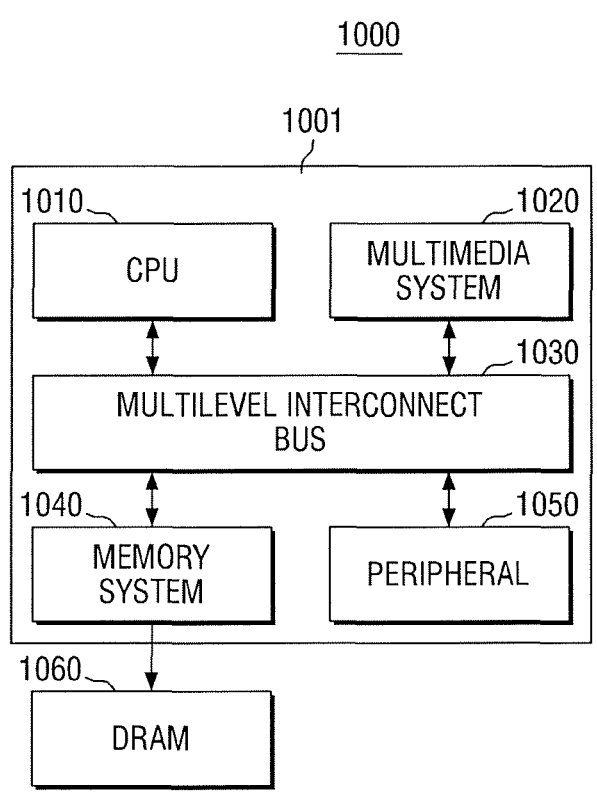
FIG. 20 is a block diagram illustrating a system-on-chip (SoC) including a semiconductor device that is fabricated using a method for fabricating a semiconductor device according to exemplary embodiments of the present inventive concept.

FIG. 20 is a block diagram of a system-on-chip (SoC) including a semiconductor device that is fabricated using a method for fabricating a semiconductor device according to exemplary embodiments of the present inventive concept.

Referring to FIG. 20, a SoC 1000 includes an application processor 1001 and a DRAM 1060.

The application processor 1001 may include a central processing unit 1010, a multimedia system 1020, a bus 1030, a memory system 1040, and a peripheral circuit 1050.

The central processing unit 1010 may perform operations required to drive the SoC 1000. In some exemplary embodiments of the present inventive concept, the central processing unit 1010 may be configured in a multi-core environment and may include a plurality of cores.

The multimedia system 1020 may be used when the SoC 1000 performs various kinds of multimedia functions. The multimedia system 1020 may include a 3D engine module, a video codec, a display system, a camera system, and a post-processor.

The bus 1030 may be used when the central processing unit 1010, the multimedia system 1020, the memory system 1040, and the peripheral circuit 1050 perform data communication with each other. In some exemplary embodiments of the present inventive concept, the bus 103 may have a multilayer structure. Specifically, examples of the bus 1030 may include a multilayer AHB (Advanced High-performance Bus) and a multilayer AXI (Advanced eXtensible Interface), but the present inventive concept is not limited thereto.

The memory system 1040 may provide a proper environment for enabling high-speed operation between the application processor 1001 and an external memory (e.g., DRAM 1060). In some exemplary embodiments of the present inventive concept, the memory system 1040 may include a separate controller (e.g., DRAM controller) for controlling the external memory (e.g., DRAM 1060).

The peripheral circuit 1050 may provide an environment for smoothly connecting the SoC 1000 to the external device (e.g., main board). Accordingly, the peripheral circuit 1050 may be provided with various interfaces for making the external device connected to the SoC 1000 compatible.

The DRAM 1060 may function as an operating memory for the operation of the application processor 1001. In some exemplary embodiments of the present inventive concept, the DRAM 1060 may be arranged on an outside of the application processor 1001 as illustrated in the drawing. Specifically, the DRAM 1060 and the application processor 1001 may be packaged in the form of PoP (Package on Package).

At least one of the constituent elements of the SoC system 1000 may be fabricated through the method for fabricating a semiconductor device according to exemplary embodiments of the present inventive concept.

Figure 21:
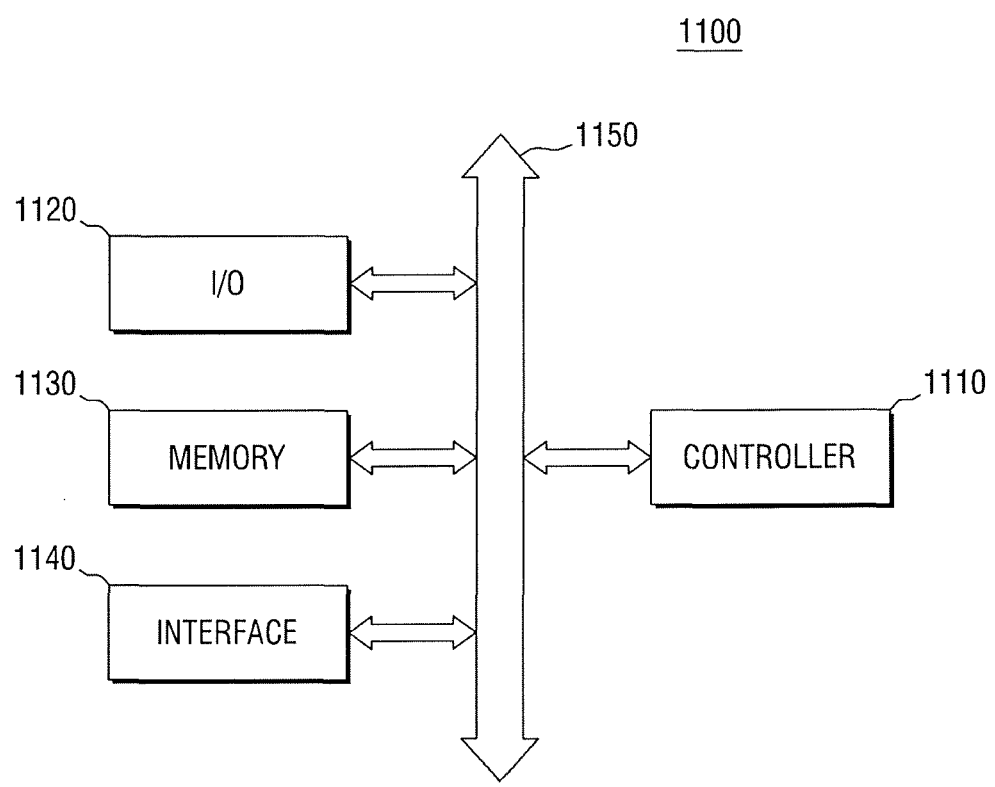
FIG. 21 is a block diagram illustrating an electronic system including a semiconductor device that is fabricated using a method for fabricating a semiconductor device according to exemplary embodiments of the present inventive concept.

FIG. 21 is a block diagram of an electronic system including a semiconductor device that is fabricated using a method for fabricating a semiconductor device according to exemplary embodiments of the present inventive concept.

Referring to FIG. 21, an electronic system 1100 according to an exemplary embodiment of the present inventive concept may include a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 may correspond to paths through which data is transferred.

The controller 1110 may include at least one of a microprocessor, a digital signal processor, a microcontroller, and logic elements that can perform similar functions. The I/O device 1120 may include a keypad, a keyboard, and a display device. The memory 1130 may store data and/or commands. The interface 1140 may function to transfer data to a communication network or receive the data from the communication network. The interface 1140 may be of a wired or wireless type. For example, the interface 1140 may include an antenna or a wire/wireless transceiver.

Although not illustrated, the electronic system 1100 may further include a high-speed DRAM and/or SRAM as an operating memory for speeding up the operation of the controller 1110. In this case, as the operating memory, the semiconductor device that is fabricated using the method for fabricating a semiconductor device according to the above-described embodiments of the present inventive concept may be adopted.

Further, the semiconductor device that is fabricated through the method for fabricating a semiconductor device according to the above-described embodiments of the present inventive concept may be provided in the memory 1130, or may be provided as a part of the controller 1110 or the I/O device 1120.

The electronic system 1100 may be applied to a PDA (Personal Digital Assistant), a portable computer, a tablet computer, a wireless phone, a mobile phone, a digital music player, a memory card, or all electronic devices that can transmit and/or receive information in wireless environments.

Figure 22:
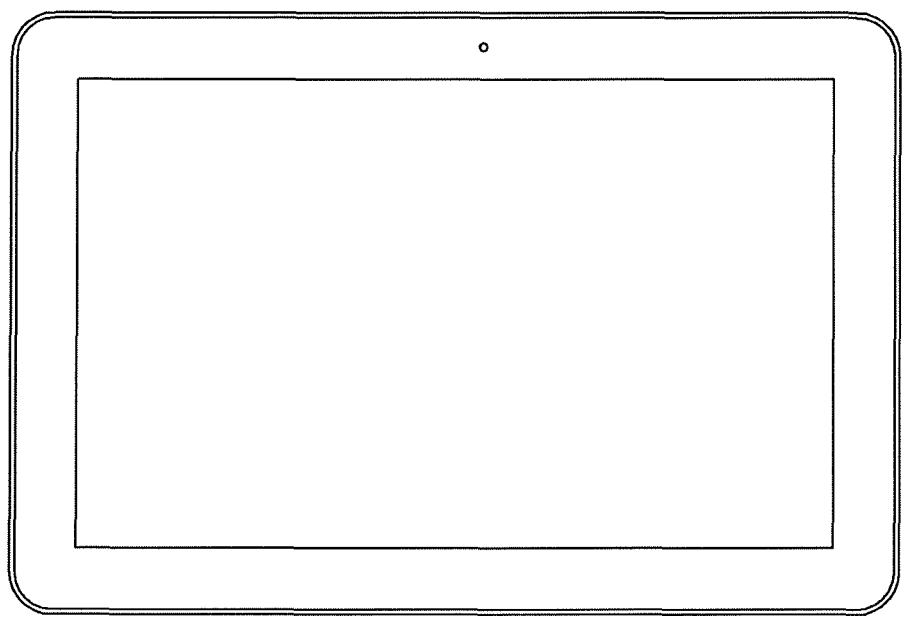
FIGS. 22 to 24 are schematic diagrams illustrating exemplary semiconductor systems to which a semiconductor device that is fabricated using a method for fabricating a semiconductor device according to exemplary embodiments of the present inventive concept can be applied.
Figure 23:
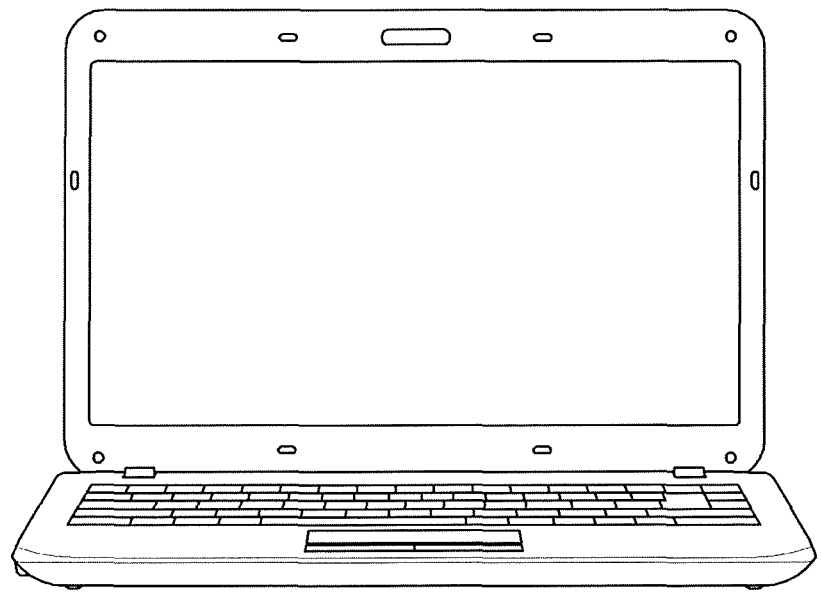
Figure 24:
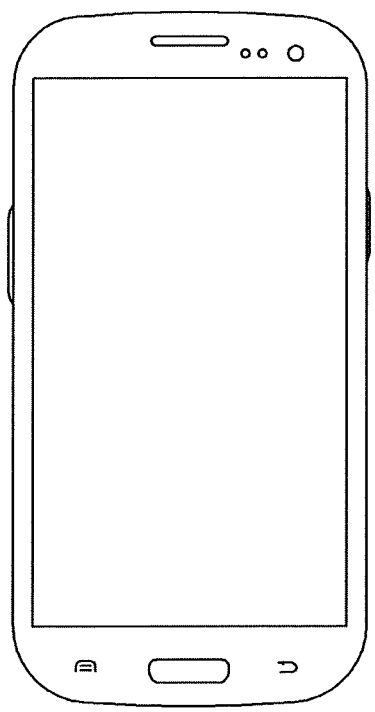

FIGS. 22 to 24 are diagrams illustrating exemplary semiconductor systems to which a semiconductor device that is fabricated using a method for fabricating a semiconductor device according to exemplary embodiments of the present inventive concept can be applied.

FIG. 22 illustrates a tablet PC 1200, FIG. 23 illustrates a notebook computer 1300, and FIG. 24 illustrates a smart phone 1400. At least one of the semiconductor devices that are fabricated using the method for fabricating a semiconductor device according to exemplary embodiments of the present inventive concept may be used in the tablet PC 1200, the notebook computer 1300, or the smart phone 1400.

Further, semiconductor devices that are fabricated in accordance with methods for fabricating a semiconductor device according to exemplary embodiments of the present inventive concept may be applied to other integrated circuit devices that have not been discussed herein.

For example, although the tablet PC 1200, the notebook computer 1300, and the smart phone 1400 have been described as examples of the semiconductor system according to exemplary embodiments of the present invention, the invention is not limited to application in such devices.

In some exemplary embodiments of the present inventive concept, the semiconductor system may be implemented as a computer, UMPC (Ultra Mobile PC), workstation, netbook, PDA (Personal Digital Assistant), portable computer, wireless phone, mobile phone, e-book, PMP (Portable Multimedia Player), portable game machine, navigation device, black box, digital camera, 3D television set, digital audio recorder, digital audio player, digital picture recorder, digital picture player, digital video recorder, or digital video player.

The foregoing is illustrative of the present inventive concept and is not to be construed as limiting thereof. Although exemplary embodiments of the present inventive concept have been described, those skilled in the art will readily appreciate that many modifications are possible in the embodiments without materially departing from the novel teachings and aspects of the present inventive concept. Accordingly, all such modifications are intended to be included within the scope of the present inventive concept as defined in the claims. Therefore, it is to be understood that the foregoing is illustrative of the present inventive concept and is not to be construed as limited to the specific embodiments disclosed, and that modifications to the disclosed embodiments, as well as other embodiments, are intended to be included within the scope of the present invention.

What is claimed is:

1. A method for fabricating a semiconductor device, comprising:
    forming a first mask pattern and a second mask pattern on a first layer;
    forming a block mask on the first layer to cover the second mask pattern and not the first mask pattern;
    forming first spacers on side walls of the first mask pattern;
    removing the first mask pattern and the block mask to expose the second mask pattern;
    etching the first layer using the first spacers and the second mask pattern as etch masks to form a third mask pattern and a fourth mask pattern; and
    forming second spacers and third spacers on side walls of the third mask pattern and side walls of the fourth mask pattern, respectively.

2. The method of claim 1, wherein the first spacers are formed on the side walls of the first mask pattern after the block mask is formed, and
    the side walls of the fourth mask pattern are aligned with the side walls of the second mask pattern.

3. The method of claim 2, wherein the forming of the first spacers comprises forming dummy spacers on side walls of the block mask.

4. The method of claim 1, wherein the first spacers are formed on the side walls of the first mask pattern before the block mask is formed,
    wherein the forming the first spacers comprises forming fourth spacers on side walls of the second mask pattern, and
    wherein the block mask simultaneously covers the second mask pattern and the fourth spacers.

5. The method of claim 4, wherein the removing the first mask pattern and the block mask comprises removing the block mask after the first mask pattern is removed.

6. The method of claim 1, wherein the third mask pattern and the fourth mask pattern are simultaneously formed.

7. The method of claim 1, further comprising removing the third mask pattern and the fourth mask pattern.

8. The method of claim 7, further comprising:
    sequentially forming a second layer, that includes a semiconductor material, and the first layer before the first mask pattern and the second mask pattern are formed; and
    forming fins by etching the second layer using the second spacers as etch masks.

9. The method of claim 7, further comprising:
sequentially forming a conductive material layer and the first layer before the first mask pattern and the second mask pattern are formed; and
forming conductive patterns by etching the conductive material layer using the second spacers as etch masks.

10. The method of claim 1, wherein the first mask pattern is formed in a logic region, and the second mask pattern is formed in a memory cell region.

11. The method of claim 1, wherein a second layer and the first layer are sequentially formed before the first mask pattern and the second mask pattern are formed,
wherein the forming the first spacers includes conformally forming a first spacer layer on the first layer, the first mask pattern, and the block mask, and etching the first spacer layer, and
wherein the forming the second spacers includes conformally forming a second spacer layer on the second layer, the third mask pattern, and the fourth mask pattern, and etching the second spacer layer.

12. A method for fabricating a semiconductor device, comprising:
forming a first layer on a semiconductor substrate;
forming a second layer on the first layer;
etching the second layer to form a first mask pattern and a second mask pattern;
forming a block mask on the second layer to cover the second mask pattern and not the first mask pattern;
forming first spacers on two opposite side walls of the first mask pattern;
removing the block mask after the first mask pattern is removed to expose the second mask pattern;
etching the second layer using the first spacers and the second mask pattern as etch masks to form a third mask pattern and a fourth mask pattern;
forming second spacers and third spacers on two opposite side walls of the third mask pattern and the fourth mask pattern, respectively;
removing the third mask pattern and the fourth mask pattern; and
etching the semiconductor substrate using the second spacers as etch masks.

13. The method of claim 12, wherein the forming of the first spacers comprises forming dummy spacers on side walls of the block mask, and
wherein a height of the first spacers is different from a height of the dummy spacers.

14. A method for fabricating a semiconductor device, comprising:
forming a first layer on a semiconductor substrate;
forming a second layer on the first layer;
forming a first mask pattern and a second mask pattern on the second layer;
forming first spacers and second spacers on two opposite side walls of the first mask pattern and the second mask pattern, respectively;
forming a block mask on the second layer to cover the second spacers but not the first spacers;
removing the block mask after the first mask pattern is removed
forming a third mask pattern and a fourth mask pattern using the first spacers, the second spacers, and the second mask pattern as masks;
forming third spacers and fourth spacers on two opposite side walls of the third mask pattern and the fourth mask pattern, respectively;
removing the third mask pattern and the fourth mask pattern; and
etching the semiconductor substrate using the third spacers and the fourth spacers as etch masks.

15. The method of claim 14, wherein the third mask pattern and the fourth mask pattern are simultaneously formed.

16. A method for fabricating a semiconductor device, comprising:
forming a sacrificial layer on a semiconductor substrate;
forming a first mask pattern and a second mask pattern, spaced apart from each other, on the sacrificial layer, wherein the first mask pattern is formed over a region of the semiconductor substrate having a first pattern pitch and the second mask pattern is formed over a region of the semiconductor substrate having a second pattern pitch that is less than the first pattern pitch;
forming a block mask over the second mask pattern but not the first mask pattern;
forming a spacer layer having a constant thickness over the sacrificial layer, the first mask pattern, and the block mask;
partially removing the spacer layer such that a portion of the spacer layer remains on two opposing sidewalls of the first mask pattern; and
etching the sacrificial layer using the remaining portion of the spacer layer as a mask.

17. The method of claim 16, further comprising removing the remaining portion of the spacer layer.

18. The method of claim 17, wherein a dummy spacer is created on the semiconductor substrate when etching the sacrificial layer using the remaining portion of the spacer layer as a mask as a result of a side wall portion of the first spacer layer additionally remains on a sidewall of the first block mask.

19. The method of claim 18, wherein etching the sacrificial layer using the remaining portion of the spacer layer as a mask additionally includes using the remaining portion of the spacer layer on the sidewall of the first block mask as a mask.

20. The method of claim 16, wherein the semiconductor substrate includes an epitaxial layer.

* * * * *